US011012099B1

(12) United States Patent
Cyprus et al.

(10) Patent No.: US 11,012,099 B1
(45) Date of Patent: May 18, 2021

(54) HALF-SIZE DATA ARRAY FOR ENCODING BINARY SYMMETRY-INVARIANT PRODUCT CODES

(71) Applicant: INTERNATIONAL BUSINESS MACHINES CORPORATION, Armonk, NY (US)

(72) Inventors: Robert A. Cyprus, Sugar Land, TX (US); Charles Camp, Sugar Land, TX (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 16/666,613

(22) Filed: Oct. 29, 2019

(51) Int. Cl.
*H03M 13/00* (2006.01)
*H03M 13/29* (2006.01)
*H04L 1/00* (2006.01)
*G06F 11/10* (2006.01)

(52) U.S. Cl.
CPC ..... *H03M 13/2909* (2013.01); *G06F 11/1068* (2013.01); *H04L 1/0042* (2013.01); *H04L 1/0061* (2013.01)

(58) Field of Classification Search
None
See application file for complete search history.

(56) References Cited

U.S. PATENT DOCUMENTS 7,774,688 B1 8/2010 Teng et al.
8,499,219 B2 7/2013 Wang
8,762,821 B2 6/2014 Wu et al.
9,166,626 B2 10/2015 Ha et al.
9,397,705 B2 7/2016 Yen et al.
9,760,435 B2 9/2017 Das
9,996,420 B2 6/2018 Mittelholzer et al.
10,009,043 B2 6/2018 Motwani
10,103,750 B2 10/2018 Sugihara et al.
2011/0099452 A1 4/2011 Rumbolt et al.
2014/0173386 A1 6/2014 Kern et al.
2016/0188230 A1 6/2016 Blaettler et al.
(Continued)

FOREIGN PATENT DOCUMENTS

DE 102017216264 A1 3/2019
TW 201140567 A 11/2011

OTHER PUBLICATIONS

Emmadi et al.; "Half-Product Codes Flash Memory", Mar. 2015.
(Continued)

*Primary Examiner* — Guerrier Merant
(74) *Attorney, Agent, or Firm* — Brian F. Russell; Stosch Sabo

(57) ABSTRACT

An encoder encodes input data utilizing a binary symmetry-invariant product code. The encoder includes circuitry including a half-size data array including D rows each having storage for H data bits (D=2×H+1). The encoder is configured to access bits of each row of the product code by reading a first H-bit data word from one of the D rows and a second H-bit data word across H different rows of the half-size data array. The encoder additionally includes a register configured to receive the bits of each row of the product code and to rotate the bits to obtain the rows of the product code and a row parity generator configured to generate row parity for each row of the product code. The encoder finally includes a column parity generator configured to generate, based on the row parity, column parities for the parity bits of all rows of the product code.

19 Claims, 15 Drawing Sheets

(56) References Cited

U.S. PATENT DOCUMENTS

| | | | |
|---|---|---|---|
| 2018/0115325 | A1 | 4/2018 | Blaettler et al. |
| 2018/0167088 | A1 | 6/2018 | Vakilinia et al. |
| 2018/0205398 | A1 | 7/2018 | Shany et al. |

OTHER PUBLICATIONS

Mittelholzer et al.; "Improving The Error-Floor Performance of Binary Half Product Codes", Oct. 2016.

Cyprus, Robert A., et al., U.S. Appl. No. 16/666,613, filed Oct. 29, 2019—Appendix P.

Hager, C. et al. (Sep. 2016). Density evolution for deterministic generalized product codes with higher-order modulation. 2016 9th International Symposium on Turbo Codes and Iterative Information Processing (ISTC), 236-240. doi: 10.1109/istc.2016.7593112.

Hager, C., & Pfister, H. A (Mar. 2018). Approaching miscorrection-free performance of product codes with anchor decoding. IEEE Transactions on Communications, 66(7), 2797-2808. doi: 10.1109/tcomm.2018.2816073.

Mittelholzer, T. et al. (Oct. 2015). Symmetry-based subproduct codes. 2015 IEEE International Symposium on Information Theory (ISIT), 251-255. doi: 10.1109/isit.2015.7282455.

International Business Machines Corporation; International application No. PCT/EP2020/079088, International filing date: Oct. 15, 2020, ISR/WO (International Search Report and Written Opinion) dated Dec. 9, 2020.

Mittelholzer Thomas et al: "Symmetry-based subproduct codes", 2015 IEEE International Symposium on Information Theory (ISIT), IEEE, Jun. 14, 2015 (Jun. 14, 2015), pp. 251-255, XP033219775,001: 10.1109/ISIT.2015.7282455 [retrieved on Jan. 14, 2021].

Santosh Kumar Emmadi: "Half-Product Codes", Dec. 1, 2014 (Dec. 1, 2014), pp. 1-38, XP055753872, Retrieved from the Internet: U R L:https:lloaktrust.library.tamu.edu/bitstream/handle/1969.1/154187/ EMMADITH ESIS-2014.pdf;jsessionid=C 1 A9AFFAA98A44FF8665556D2BCA324A?sequence= 1 [retrieved on Jan. 14, 2021].

Santosh Emmadi et al: "Half-Product Codes for Flash Memory", Proc. Non-Volatile Memories Workshop, Mar. 1, 2015 (Mar. 1, 2015), pp. 1-2, XP055753866, Retrieved from the Internet URL:http://commtheory.wdfiles.com/local—files/publications/NVM2015.pdf [retrieved on Jan. 14, 2021] p. 1, right-hand column.

Mittelholzer Thomas et al: "Improving the error-floor performance of binary half-product codes", 2016 International Symposium on Information Theory and Its Applications (iSITA), IEICE, Oct. 30, 2016 (Oct. 30, 2016), pp. 295-299, XP033057157, [retrieved on Jan. 14, 2021 p. 295, left-hand column—p. 296, left-hand column.

1100

1104

SRL Column Chain -- Load 14

| Row | N/A | 6 | 5 | 4 | 3 | 2 | 1 | 0 |
|---|---|---|---|---|---|---|---|---|
| 14 | 0 | D14.6 | D14.5 | D14.4 | D14.3 | D14.2 | D14.1 | D14.0 |
| 13 | 0 | D13.6 | D13.5 | D13.4 | D13.3 | D13.2 | D13.1 | D13.0 |
| 12 | 0 | D12.6 | D12.5 | D12.4 | D12.3 | D12.2 | D12.1 | D12.0 |
| 11 | 0 | D11.6 | D11.5 | D11.4 | D11.3 | D11.2 | D11.1 | D11.0 |
| 10 | 0 | D10.6 | D10.5 | D10.4 | D10.3 | D10.2 | D10.1 | D10.0 |
| 9 | 0 | D9.6 | D9.5 | D9.4 | D9.3 | D9.2 | D9.1 | D9.0 |
| 8 | 0 | D8.6 | D8.5 | D8.4 | D8.3 | D8.2 | D8.1 | D8.0 |
| 7 | 0 | D7.6 | D7.5 | D7.4 | D7.3 | D7.2 | D7.1 | D7.0 |
| 6 | 0 | D6.6 | D6.5 | D6.4 | D6.3 | D6.2 | D6.1 | D6.0 |
| 5 | 0 | D5.6 | D5.5 | D5.4 | D5.3 | D5.2 | D5.1 | D5.0 |
| 4 | 0 | D4.6 | D4.5 | D4.4 | D4.3 | D4.2 | D4.1 | D4.0 |
| 3 | 0 | D3.6 | D3.5 | D3.4 | D3.3 | D3.2 | D3.1 | D3.0 |
| 2 | 0 | D2.6 | D2.5 | D2.4 | D2.3 | D2.2 | D2.1 | D2.0 |
| 1 | 0 | D1.6 | D1.5 | D1.4 | D1.3 | D1.2 | D1.1 | D1.0 |
| 0 | 0 | D0.6 | D0.5 | D0.4 | D0.3 | D0.2 | D0.1 | D0.0 |

HALF-SIZE DATA ARRAY FOR ENCODING BINARY SYMMETRY-INVARIANT PRODUCT CODES

BACKGROUND OF THE INVENTION

This disclosure relates to data processing, and more specifically, to efficient encoding and decoding of data utilizing a binary symmetry-invariant product code (e.g., half product code), for example, in data storage systems or data communication systems.

Error-correction encoding is employed in data storage systems and data communication systems to improve the accuracy with which data can be recovered from a data channel. By encoding data in accordance with an error-correction code (ECC) before supplying the data to the channel, errors at the channel output can be identified and corrected to an extent dependent on the properties of the ECC. Numerous such ECC schemes are known. One well-known class of ECC scheme is based on product codes. A product code uses two component ECC codes to encode rows and columns of a notional two-dimensional array of input data.

The basic structure of a conventional product code is illustrated schematically in FIG. 1. The input data symbols (which in general may be $q^{ary}$ symbols, having q possible symbol values, where q≥2) are assigned to respective symbol locations in a notional array having $n_2$ rows and $n_1$ columns of symbol locations. In this example, $k_2 \times k_1$ data symbols are assigned to respective locations in a $k_2$ by $k_1$ subarray at the intersection of the first $k_2$ rows and first $k_1$ columns of the $n_2$ by $n_1$ array. The resulting array of input data symbols is encoded by separately encoding the rows and columns of the array. A first ECC code C1 is used to encode the $k_1$-symbol data word in each row of the array into a length-$n_1$ C1 codeword. This example uses systematic encoding, whereby the input data is retained in the codeword. In particular, the $n_1$ code symbols of a C1 codeword are obtained by adding $(n_1-k_1)$ parity symbols after the $k_1$-symbol data word in a given row. A second ECC code C2 is then used to encode the $k_2$-symbols in each column of the array into a length-$n_2$ C2 codeword, here by adding $(n_2-k_2)$ parity symbols at the end of each column. The resulting $n_2 \times n_1$ code symbols in the array form the output codeword of the product code. In an extension of this basic idea, an interleaved product code applies the C2 code over s>1 evenly spaced columns of the array, resulting in $n_1/s$ C2 codewords.

Product codes can offer practical encoder/decoder implementations, their decoders being hard-decision based and thus avoiding the various complexity and latency issues associated with soft-decision decoding. Some decoders for interleaved product codes use the technique of iterative decoding based on a graph defined from the basic code structure. Briefly, a bipartite graph can be defined with $n_2$ right nodes, each corresponding to a C1 codeword, and $n_1/s$ left nodes corresponding to respective C2 codewords. Each right node is connected to each left node by s edges. The s edges connecting a pair of nodes represent the s common symbols at the intersections of the C1 and C2 codewords for those nodes in the notional array described above. Iterative decoding is performed based on the graph by decoding the C1 codewords one-by-one, then decoding the C2 codewords one-by-one. Each time a codeword is successfully decoded, the edges leaving the appropriate node are corrected. The process iterates until decoding is complete, that is, either no more errors are detected by the decoder or a predetermined maximum number of iterations has been reached, in which case, the decoder may declare a decoding failure.

Another ECC scheme based on product codes was proposed in the context of optical transmission networks (OTNs) in J. Justesen, "Error correcting coding for OTN," IEEE Communications Magazine, September 2010, and J. Justesen, Performance of Product Codes and Related Structures with Iterative Decoding, IEEE Transactions on Communications, 2011. These codes, referred to as half product codes (HPCs), are product codes which use identical codes for the row code C1 and the column code C2. If each component code C1 and C2 is a rate k/n code with a code length (i.e., number of symbols in a codeword) of n, and a dimension (i.e., number of data symbols encoded into each codeword) of k, then the resulting product code C has length $N=n^2$, dimension $K=k^2$, and rate $(k/n)^2$. A codeword of C can be defined by an (n by n)-symbol matrix X corresponding to the notional array described above, where each row and column of X is a codeword of the row/column code. The corresponding half product code $C_H$ is then defined by $C_H=\{X-X^T:X\in C\}$, where $X^T$ is the transpose matrix of X.

Note that if X is a codeword then so is $X^T$ because the row and column codes are the same. By construction, every codeword $Y_H$ of $C_H$ has a zero major diagonal (although either major diagonal can be a zero major diagonal, the zero major diagonal is defined herein as the line of symbols extending diagonally across the (n by n)-symbol matrix $Y_H$ from the top right symbol to the bottom left symbol). That is, all symbols on the zero major diagonal are of value zero. Since it follows from the definition of $C_H$ that $Y_H=Y_H^T$, the set of n(n−1)/2 symbols in the triangular subarray on each side of the zero major diagonal is the same. These n(n−1)/2 symbols thus define the codeword $Y_H$ such that the half product code has an effective length of $N_H=n(n-1)/2$. With HPCs, encoding and iterative decoding is conventionally performed in the same manner as for product codes, but the input data is restricted to the triangular subarray on one side of the zero major diagonal, giving a dimension of $K_H=k(k-1)/2$ for the HPC.

An exemplary prior art HPC 200 is illustrated in FIG. 2. To form HPC 200 in the prior art, the original input data 204 is packed into a square array below zero major diagonal 202. Once all original input data 204 is filled, symmetrical duplicate data 206 is then formed by copying original input data 204, performing a bit-by-bit transpose of original input data 204, and placing the resulting data above zero major diagonal 202. Parity data 208 is then computed (e.g., utilizing a Bose-Chaudhuri-Hocquenghem (BCH) error correction function) separately for each row and column. After encoding, because of data symmetry, only the portion of the array above or below the zero major diagonal 202 needs to be stored and/or transmitted.

When data are retrieved from memory or received via a data transmission, HPC 200 can be reconstructed by duplicating and transposing the retrieved/received data to fill the array. Any errors arising during the storage, retention, retrieval, and/or transmission of the data will therefore also be symmetric about the zero major diagonal of the reconstructed array, as shown in FIG. 3. During conventional decoding (i.e., the error correction process in which rows and columns are iteratively processed to correct row and column errors), data in the array is first accessed in a row format and then accessed in a columnar format.

To achieve high performance, hardware implementations of HPC encoders and decoders would be preferred. However, a straightforward hardware implementation of a hardware encoder would form a full HPC array (including duplicate data 206) in memory and then iteratively encode each row one-by-one and then each column one-by-one. While this approach could offer much higher performance than a conventional software implementation, the present disclosure appreciates that the integrated circuitry that enables the data to be accessed in both row and column format is very expensive in terms of die area. The present disclosure also appreciates that such a hardware implementation would require row and column data to be independently encoded, meaning that no benefit would be obtained from the array symmetry.

BRIEF SUMMARY

In at least one embodiment, an encoder performs, in hardware, iterative encoding of codewords utilizing a binary symmetry-invariant product code, such as a half product code (HPC).

In at least one embodiment, the encoder includes a half-size data array including D rows each having storage for H bits, where the binary symmetry-invariant product code has row and column data dimensions of D, which is equal to 2×H+1. The encoder is configured to access bits of each row of the product code by reading a first H-bit data word from one of the D rows and a second H-bit data word across H different rows of the half-size data array. The encoder additionally includes a register configured to receive the bits of each row of the product code and to rotate the bits to obtain the rows of the product code and a row parity generator configured to generate row parity for each row of the product code. The encoder finally includes a column parity generator configured to generate, based on the row parity, column parities for the parity bits of all rows of the product code.

In at least one embodiment, the binary symmetry-invariant product code is a half product code (HPC).

In at least one embodiment, the half-size data array is implemented with a plurality of shift register latches.

In at least one embodiment, the encoder is configured to shift bits between rows of the half-size data array and to recirculate the first H-bit data word read from the half-size data array back into the half-size data array.

In at least one embodiment, the encoder forms all rows of the binary symmetry-invariant product code by reading a same set of bit storage locations within the half-size data array.

In at least one embodiment, the encoder is configured to pack the half-size data array with H bits of input data at a time.

In at least one embodiment, a method of encoding a binary symmetry-invariant product code including D data bits and P parity bits in each dimension includes packing input data in a half-size data array including D rows each having storage for H bits of input data, where D is equal to 2×H+1. The method additionally includes iteratively accessing bits of each row of the binary symmetry-invariant product code by reading a first H-bit data word from a selected one of the D rows of the half-size data array and a second H-bit data word across H different rows of the half-size data array. The bits of each row of the binary symmetry-invariant product code are rotated as needed to obtain the rows of the binary symmetry-invariant product code. Row parity for each row of the binary symmetry-invariant product code is generated. Based on row parity generated by the row parity generator, column parities for the P parity bits of all rows of the binary symmetry-invariant product code are also generated. The first H-bit data words, row parities, and column parities are output.

BRIEF DESCRIPTION OF THE SEVERAL VIEWS OF THE DRAWINGS

FIG. 11 illustrates a half-size data array that is sized to accommodate an equal number of input data bits of an HPC per row;

DETAILED DESCRIPTION

In at least one aspect, the present application is directed to an encoder that performs, in hardware circuitry, iterative encoding of data utilizing a binary symmetry-invariant product code, such as a half product code (HPC). The application is further directed to related methods.

Although the inventions described herein can be applied to conventional HPCs as discussed above, it should be appreciated that the invention disclosed herein are also applicable to symmetry-invariant product codes formed with more than one type of component code per row and more than one type of component code per column. Similarly, further extensions of HPCs can be obtained by using more than one type of component code in the code constructions. For example, one may use two types of component codes of the same length n but with different error correction capabilities $t_1$ and $t_2$. In the HPC case, one may require that the first half of the row/columns are codewords from the $t_1$-error correcting component code, and the second half of the row/columns are codewords from the $t_2$-error correcting component code.

Figure 4:
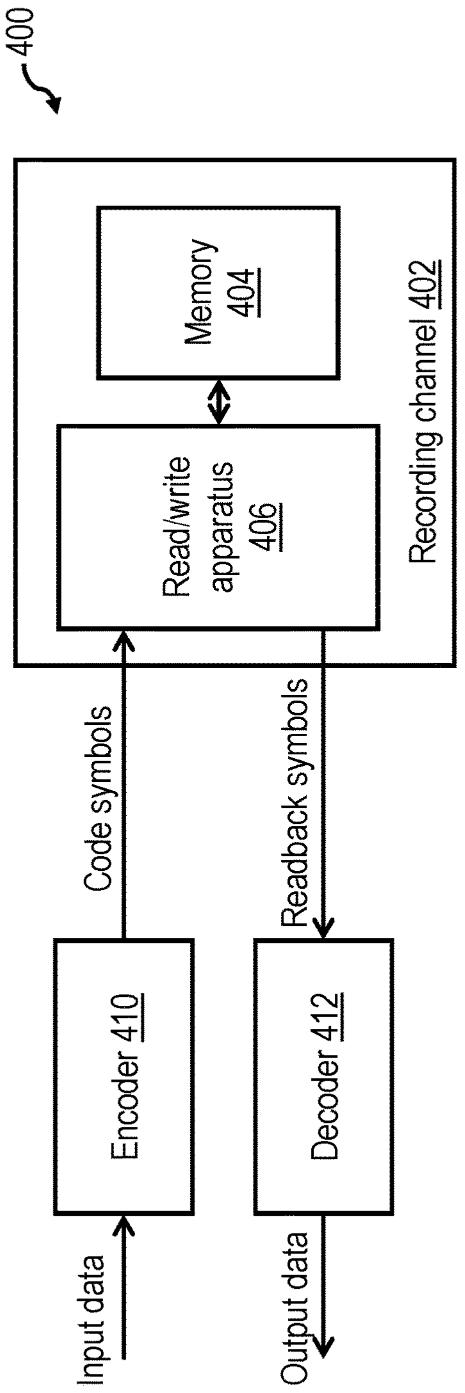
FIG. 4 is a high-level block diagram of a data storage system in accordance with one embodiment.

With reference again to the figures and in particular with reference to FIG. 4, there is a high-level block diagram of an exemplary embodiment of a data storage system 400 for reading and writing ECC-encoded data on a data storage device. Data storage system 400 includes a recording channel 402 including a memory 404 (e.g., a flash memory or other non-volatile random access memory (NVRAM)) and a read/write apparatus 406 for reading and writing data in memory 404. Although shown in FIG. 4 as a single block, memory 404 may comprise any desired configuration of data storage units ranging, for example, from a single chip or die to a plurality of storage banks each including multiple packages of memory chips. Read/write apparatus 406 performs read and write operations in known manner, addressing memory cells for read and write purposes by applying appropriate voltages to an array of word and bit lines in memory 404.

Data storage system 400 further includes an encoder 410 and a decoder 412. Encoder 410 encodes input (user) data into code symbols in accordance with a binary symmetry-invariant product code (e.g., an HPC) and outputs the code symbols to recording channel 402. Decoder 412 processes the readback symbols obtained by read/write apparatus 406 from memory 404 to decode the symmetry-invariant product code and so recover and output the original input data.

Figure 5:
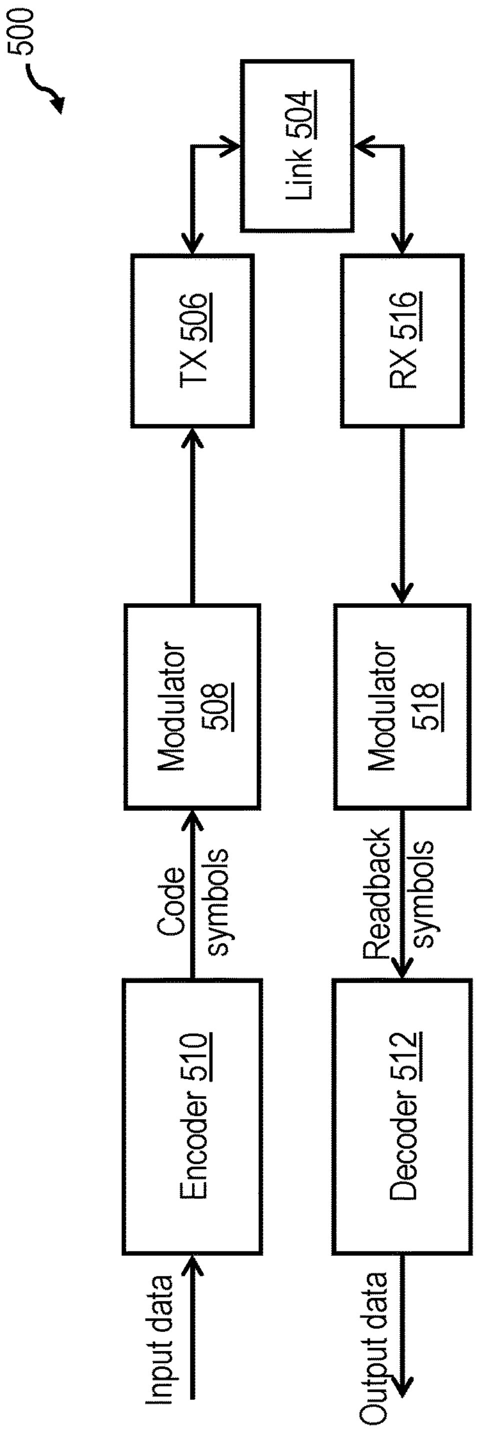
FIG. 5 is a high-level block diagram of a data communication system in accordance with one embodiment.

As further illustrated in FIG. 5, symmetry-invariant product codes such as HPCs also find application in data communication systems, such as data communication system 500. The transmitter of data communication system 500 includes an encoder 510 as described above with reference to FIG. 4, a modulator 508, and a transmission device (TX) 506. Code symbols output by encoder 510 are supplied, via modulator 508, to transmission device 506, which generates a signal for transmitting the code symbols over a communications link 504. Communications link 504 may comprise a physical (wired or wireless) link or a logical link over one or more physical links. A receiver of the data communication system includes a receiving device (RX) 516 for receiving the signal transmitted over link 504, a demodulator 518 for demodulating the received signal, and a decoder 512 as described above for decoding the resulting code symbols received from demodulator 518.

In preferred embodiments, the functionality of encoders 410, 510 and decoders 412, 512 is implemented in hardware circuitry (i.e., integrated circuitry) in order to achieve high performance. In other embodiments, however, the functionality of encoders 410, 510 and decoders 412, 512 can be implemented in hardware executing program instructions of software and/or firmware. For example, encoding and decoding can be performed in whole or in part through the execution of software that configures one or more processors as encoders and/or decoders to perform the encoding and decoding.

Figure 6:
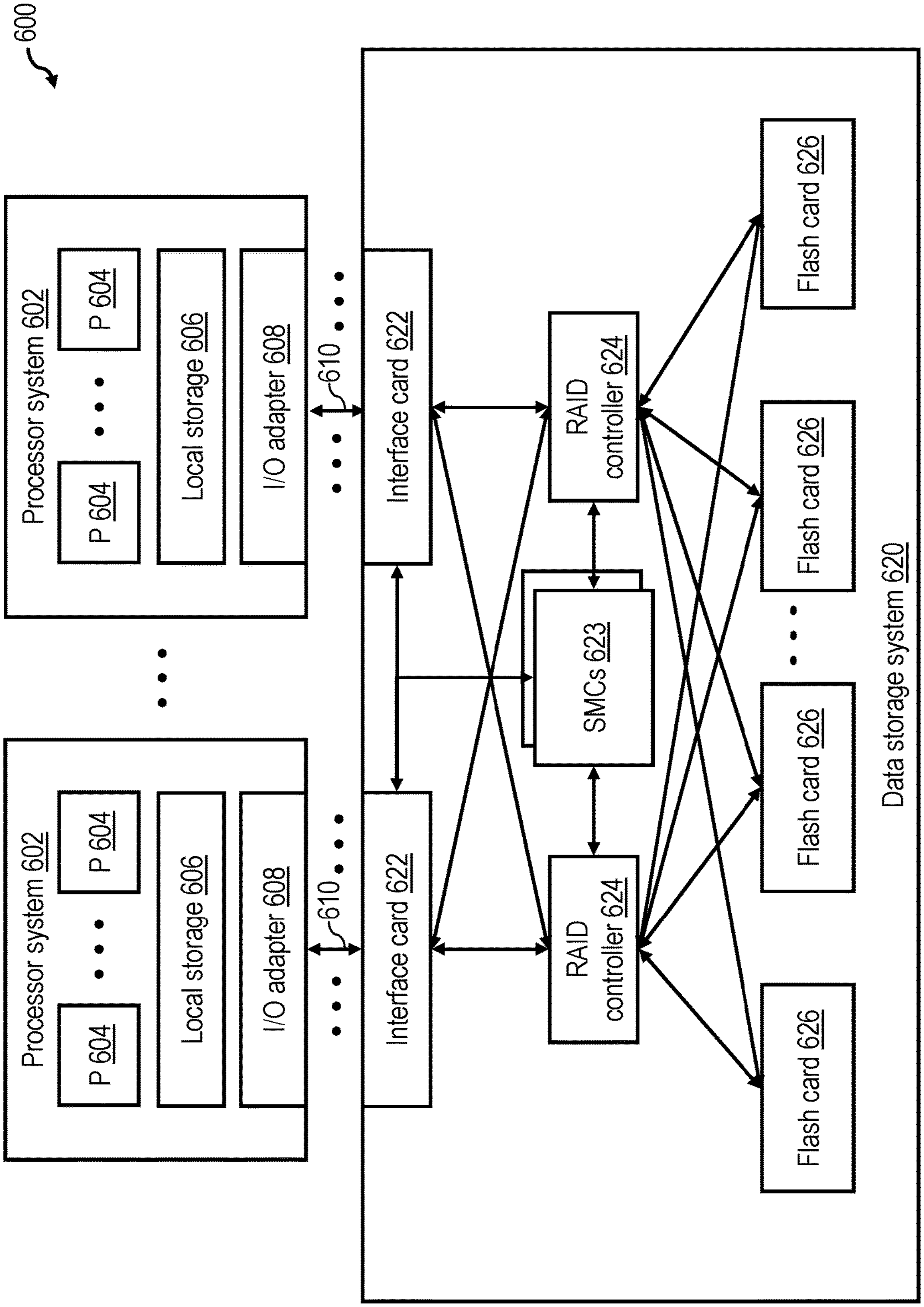
FIGS. 6-7 illustrate an exemplary implementation of the data storage system of FIG. 4.
Figure 7:
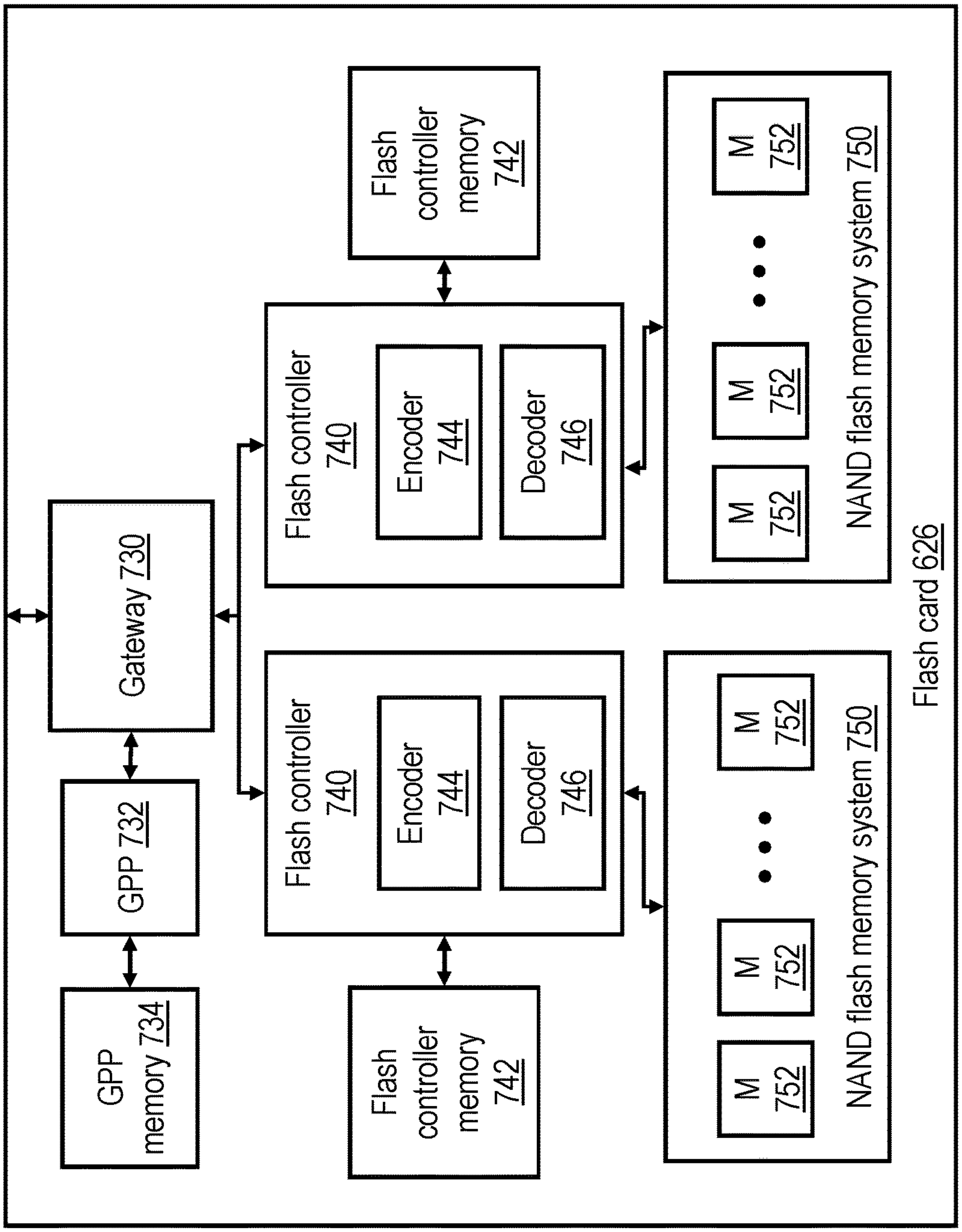

Referring now to FIGS. 6-7, there are depicted more detailed block diagrams of an exemplary implementation of a data storage system, such as data storage system 400 of FIG. 4. FIG. 6 illustrates a data processing environment 600 including one or more hosts, such as a processor system 602 having one or more processors 604 that process instructions and data. A processor system 602 may additionally include local storage 606 (e.g., dynamic random access memory (DRAM) or disks) that may store program code, operands and/or execution results of the processing performed by processor(s) 604. In various embodiments, a processor system 602 can be, for example, a mobile computing device (such as a smartphone or tablet), a laptop or desktop personal computer system, a server computer system (such as one of the POWER series of servers available from International Business Machines Corporation), or a mainframe computer system. A processor system 602 can also be an embedded processor system using various processors such as ARM, POWER, Intel X86, or any other processor combined with any of memory caches, memory controllers, local storage, I/O bus hubs, etc.

Each processor system 602 further includes an input/output (I/O) adapter 608 that is coupled directly (i.e., without any intervening device) or indirectly (i.e., through at least one intermediate device) to a data storage system 620 via an I/O channel 610. In various embodiments, I/O channel 610 may employ any one or a combination of known or future developed communication protocols, including, for example, Fibre Channel (FC), FC over Ethernet (FCoE), Internet Small Computer System Interface (iSCSI), InfiniBand, Transport Control Protocol/Internet Protocol (TCP/IP), Peripheral Component Interconnect Express (PCIe), etc. I/O requests communicated via I/O channel 610 include read requests by which a processor system 602 requests data from data storage system 620 and write requests by which a processor system 602 requests storage of data in data storage system 620.

Although not required, in the illustrated embodiment, data storage system 620 includes multiple interface cards 622 through which data storage system 620 receives and responds to I/O requests of hosts via I/O channels 610. Each interface card 622 is coupled to each of multiple Redundant Array of Inexpensive Disks (RAID) controllers 624 in order to facilitate fault tolerance and load balancing. Each of RAID controllers 624 is in turn coupled (e.g., by a PCIe bus) to non-volatile storage media, which in the illustrated example include multiple flash cards 626 bearing NAND flash memory. In other embodiments, alternative and/or additional non-volatile storage devices can be employed.

In the depicted embodiment, the operation of data storage system 620 is managed by redundant system management controllers (SMCs) 623, which are coupled to interface cards 622 and RAID controllers 624. In various embodiments, system management controller 623 can be implemented utilizing hardware or hardware executing firmware and/or software.

FIG. 7 depicts a more detailed block diagram of an exemplary embodiment of a flash card 626 of data storage system 620 of FIG. 6. Flash card 626 includes a gateway 730 that serves as an interface between flash card 626 and RAID controllers 624. Gateway 730 is coupled to a general-purpose processor (GPP) 732, which can be configured (e.g., by program code) to perform pre-processing on I/O requests received by gateway 730 and/or to schedule servicing of the I/O requests by flash card 626. GPP 732 is coupled to a GPP memory 734 (e.g., Dynamic Random Access Memory (DRAM)) that can conveniently buffer data created, referenced and/or modified by GPP 732 in the course of its processing or data flowing through the gateway 730 destined for one or more of the flash controllers 740.

Gateway 730 is further coupled to multiple flash controllers 740, each of which controls a respective NAND flash memory system 750. Flash controllers 740 can be implemented, for example, by an Application Specific Integrated Circuit (ASIC) and/or a Field Programmable Gate Array (FPGA) and/or a microprocessor, and each have an associated flash controller memory 742 (e.g., DRAM). In embodiments in which flash controllers 740 are implemented with an FPGA, GPP 732 may program and configure flash controllers 740 during start-up of data storage system 620. After startup, in general operation flash controllers 740 receive read and write requests from gateway 730 that request to read data stored in NAND flash memory system 750 and/or to store data in NAND flash memory system 750. Flash controllers 740 service these requests, for example, by accessing NAND flash memory system 750 to read or write the requested data from or into NAND flash memory system

750 or by accessing a memory cache (not illustrated) associated with NAND flash memory system 750.

Flash controllers 740 implement a flash translation layer (FTL) that provides logical-to-physical address translation to enable access to specific memory locations within NAND flash memory systems 750. In general, an I/O request received by a flash controller 740 from a host device, such as a processor system 602, contains the logical block address (LBA) at which the data is to be accessed (read or written) and, if a write request, the write data to be stored to data storage system 620. The I/O request may also specify the amount (or size) of the data to be accessed. Other information may also be communicated depending on the protocol and features supported by data storage system 620. The flash translation layer translates LBAs received from a RAID controller 624 into physical addresses assigned to corresponding physical location in NAND flash memory systems 750. Flash controllers 740 may perform address translation and/or store mappings between logical and physical addresses in a logical-to-physical translation data structure, such as a logical-to-physical translation table (LPT), which may conveniently be stored in flash controller memory 742.

NAND flash memory systems 750 may take many forms in various embodiments. In the embodiment shown in FIG. 7, each NAND flash memory system 750 includes multiple (e.g., 32) individually addressable NAND flash memory storage devices 752. In the illustrated example, the flash memory storage devices 752 take the form of a board-mounted flash memory modules, for example, Single Level Cell (SLC), Multi-Level Cell (MLC), Three Level Cell (TLC), or Quad Level Cell (QLC) NAND flash memory modules. The fidelity of data read from flash memory storage devices 752 is preferably enhanced through the implementation of ECC encoding, for example, by flash controllers 740 and/or high level controllers, such as GPPs 732 or RAID controllers 624. In the illustrated embodiment, ECC encoding and decoding is implemented at least in flash controllers 740 by an encoder 744 and decoder 746.

Figure 1:
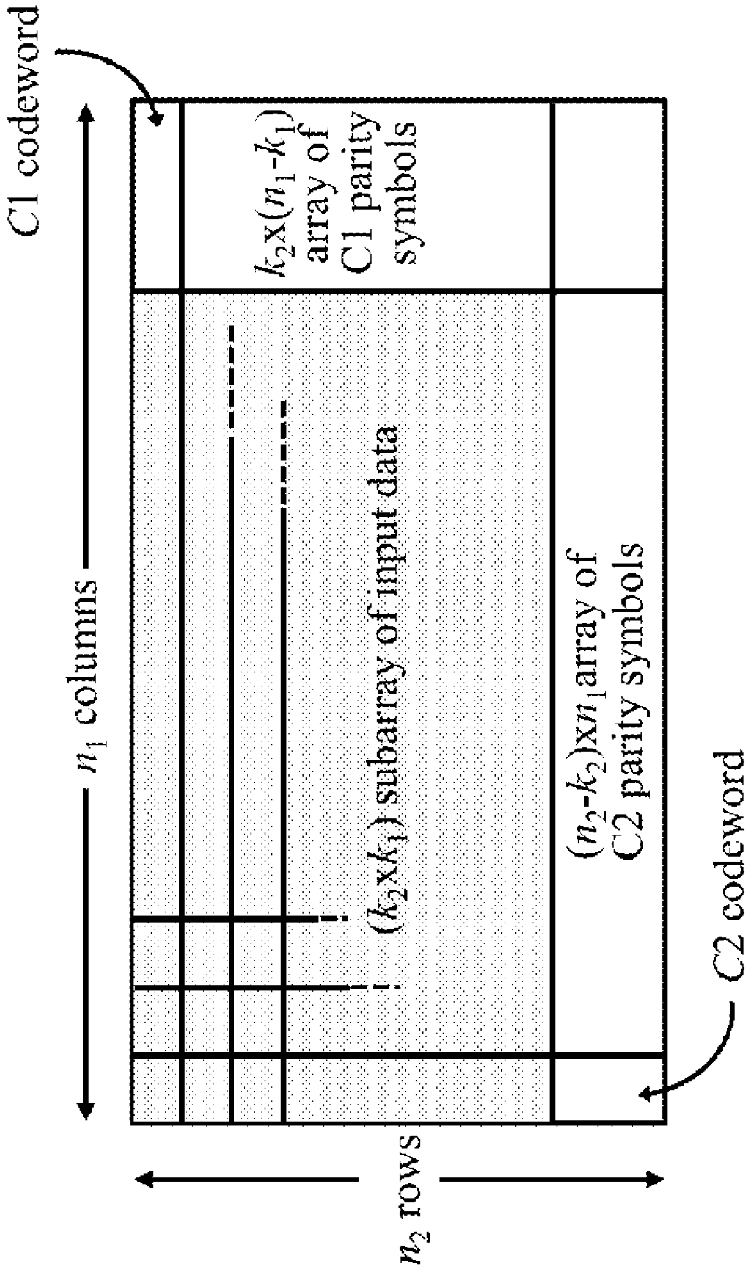
FIG. 1 illustrates a prior art product code.
Figure 2:
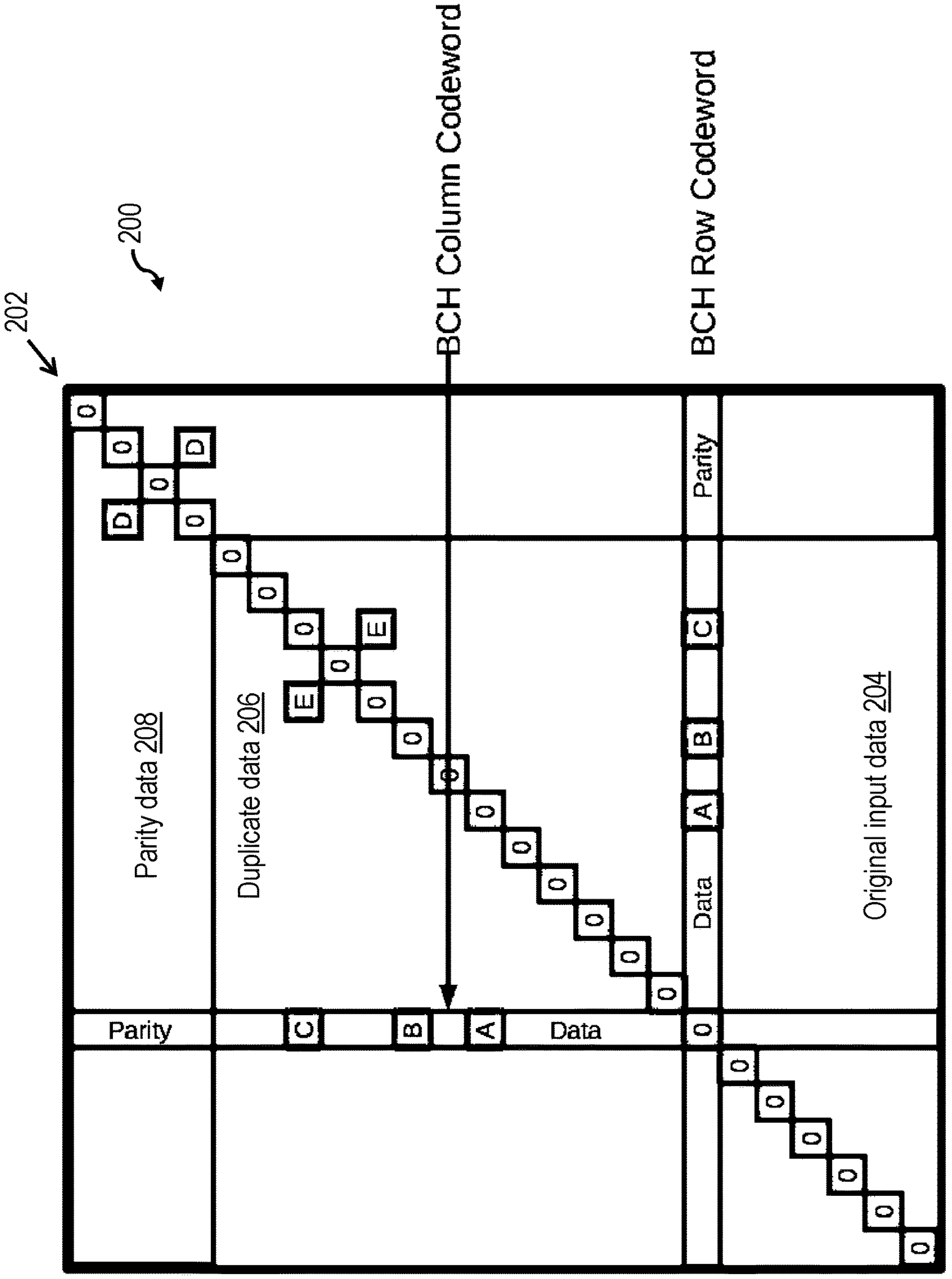
FIG. 2 illustrates a prior art half product code (HPC)
Figure 3:
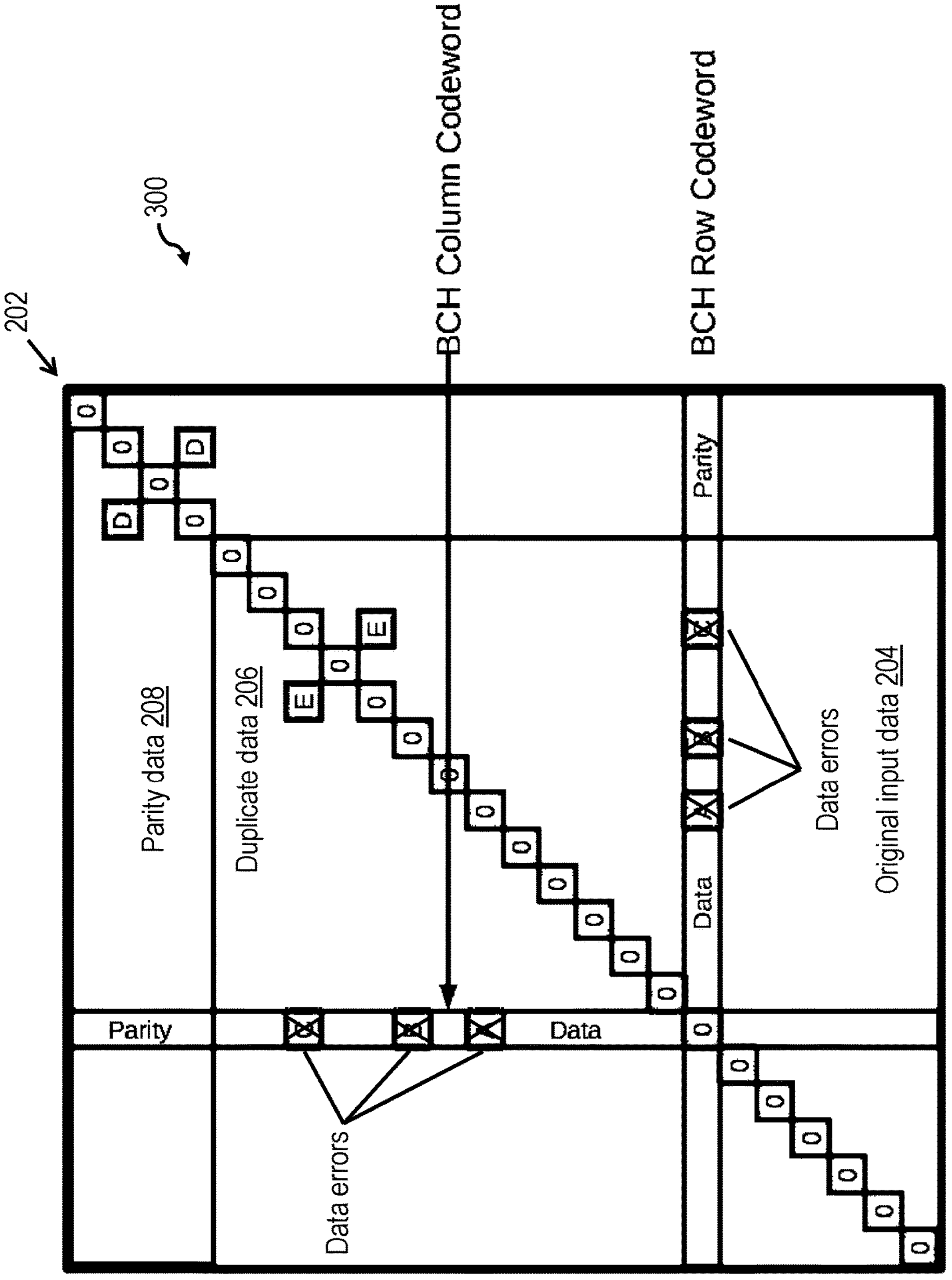
FIG. 3 depicts a prior art HPC containing symmetrical data errors.
Figure 8:
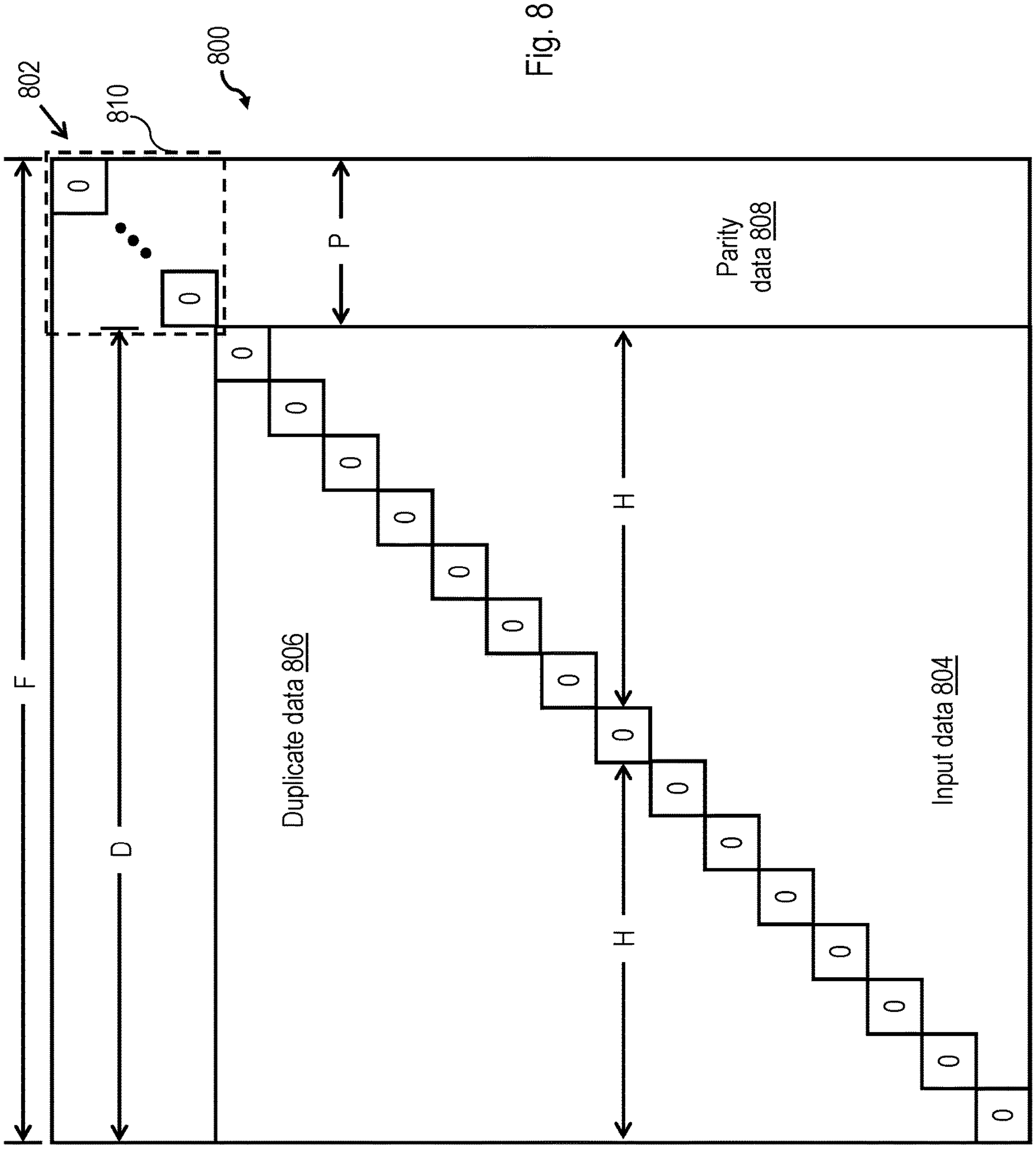
FIG. 8 depicts a conceptual HPC array in accordance with one embodiment.

Referring now to FIG. 8, there is illustrated a conceptual HPC array that will be utilized to describe the encoding and decoding performed by encoders 410, 510, and 744 and decoders 412, 512, and 746. As explained above with reference to FIG. 2, HPC array 800 is a square array having an equal number of rows and columns. HPC array 800 additionally includes a zero major diagonal, for example, zero major diagonal 802. As before, input data 804 is packed into HPC array 800 below zero major diagonal 802, and symmetrical duplicate data 806 is placed above zero major diagonal 802. Parity data 808 for each row and column is appended to the end of the relevant row or column. Parity data 808 includes a square cross-parity subarray 810 that contains the parity of the parity-only rows and columns.

In this conceptual HPC array 800, all rows and columns have a common dimension of F bits, including D bits of data and P bits of parity. As further indicated in FIG. 8, the D data bits in each row and column include a 0 data bit in zero major diagonal 802 and 2×H other bits, meaning that D is an odd integer. These dimensions can be expressed by the following relations:

$$F=D+P$$

$$D=2\times H+1$$

where F, D, P, and H are all positive integers.

In the prior art, a typical implementation would fill the triangular array below zero major diagonal 802 with bits of input data 804 until all data bits have been filled, then transpose the bits of input data 804 one at a time to create duplicate data 806. Then the parity field of each row and column would be separately calculated. This process is generally performed in software due to the difficulty in processing, in hardware, a triangular (non-rectangular) array of input data 804 in which every row includes a different number of data bits and for which computing the transpose (to form duplicate data 806) requires a unique and specific row and column access for each element.

Figure 9:
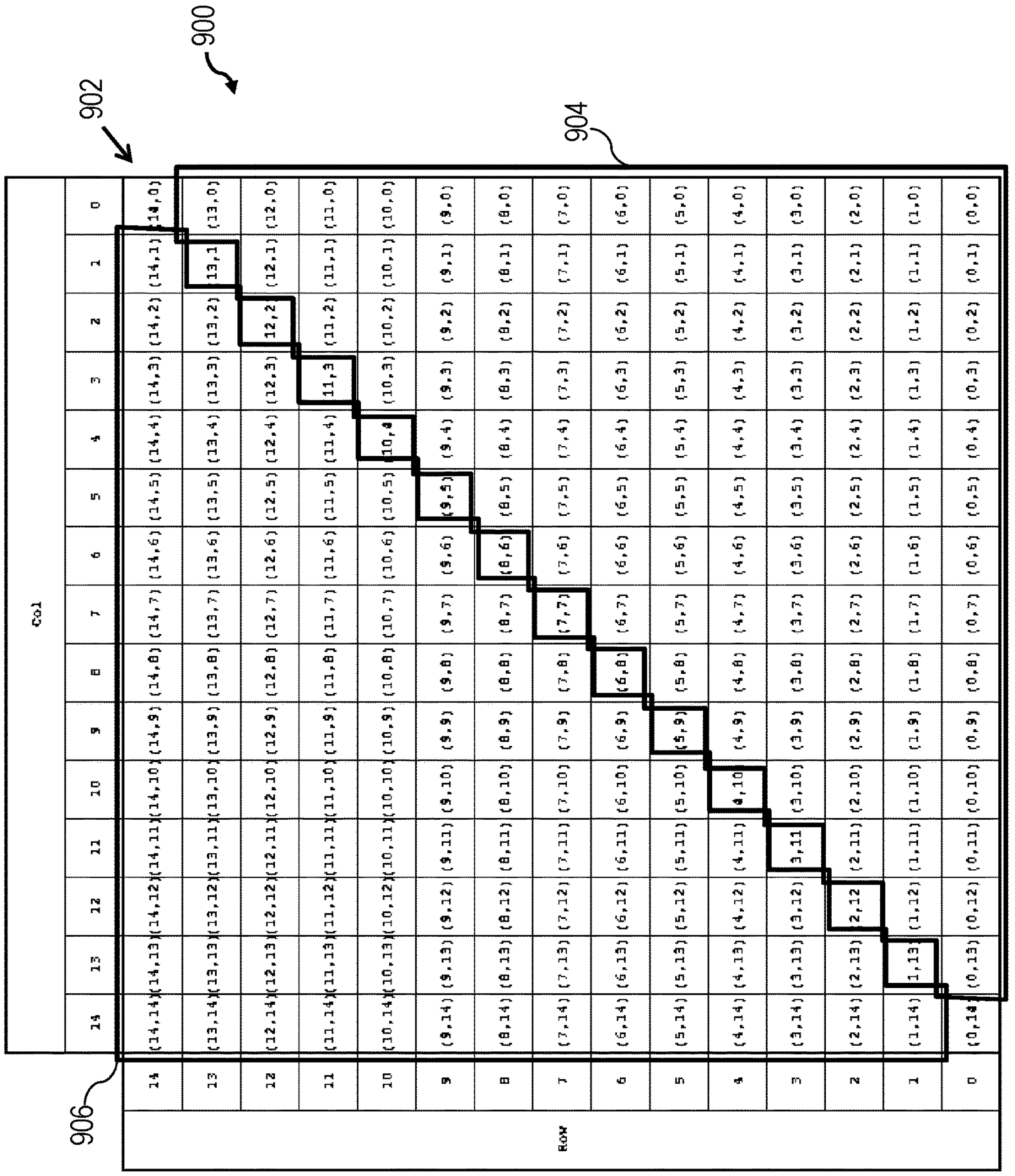
FIG. 9 illustrates the data field of a conventional HPC in which input data and duplicate data are segregated on different sides of a zero major diagonal.

The present disclosure accordingly presents innovative techniques for encoding, in hardware, input data utilizing a binary symmetry-invariant product code, such as an HPC. In order to perform this encoding in hardware utilizing compact logic, the present disclosure implements a significantly different technique of data packing than employed in the prior art. To explain this technique, reference is first made to FIG. 9, which illustrates only the data field 900 of an exemplary conventional HPC array (i.e., the parity data is omitted). In this example, data field 900 includes 15 rows numbered 0 to 14 and 15 columns numbered 0 to 14. Thus, in this example, D is 15, H is 7, and data field 900 includes 225 bits including 105 input bits, 105 duplicate bits, and 15 ‘0’ bits within the zero major diagonal. In FIG. 9, each storage location is labeled with a duple formed by the row number and column number. These duples range from (0,0) in the lower right hand corner to (14,14) in the upper left hand corner. In a conventional HPC, input data is segregated below zero major diagonal 902 in input data field 904 and duplicate data is segregated above zero major diagonal 902 in duplicate data field 906. As described above, the number of storage locations for input data in each row differs, ranging from 14 bits in row 0 to 0 bits in row 14.

Figure 10:
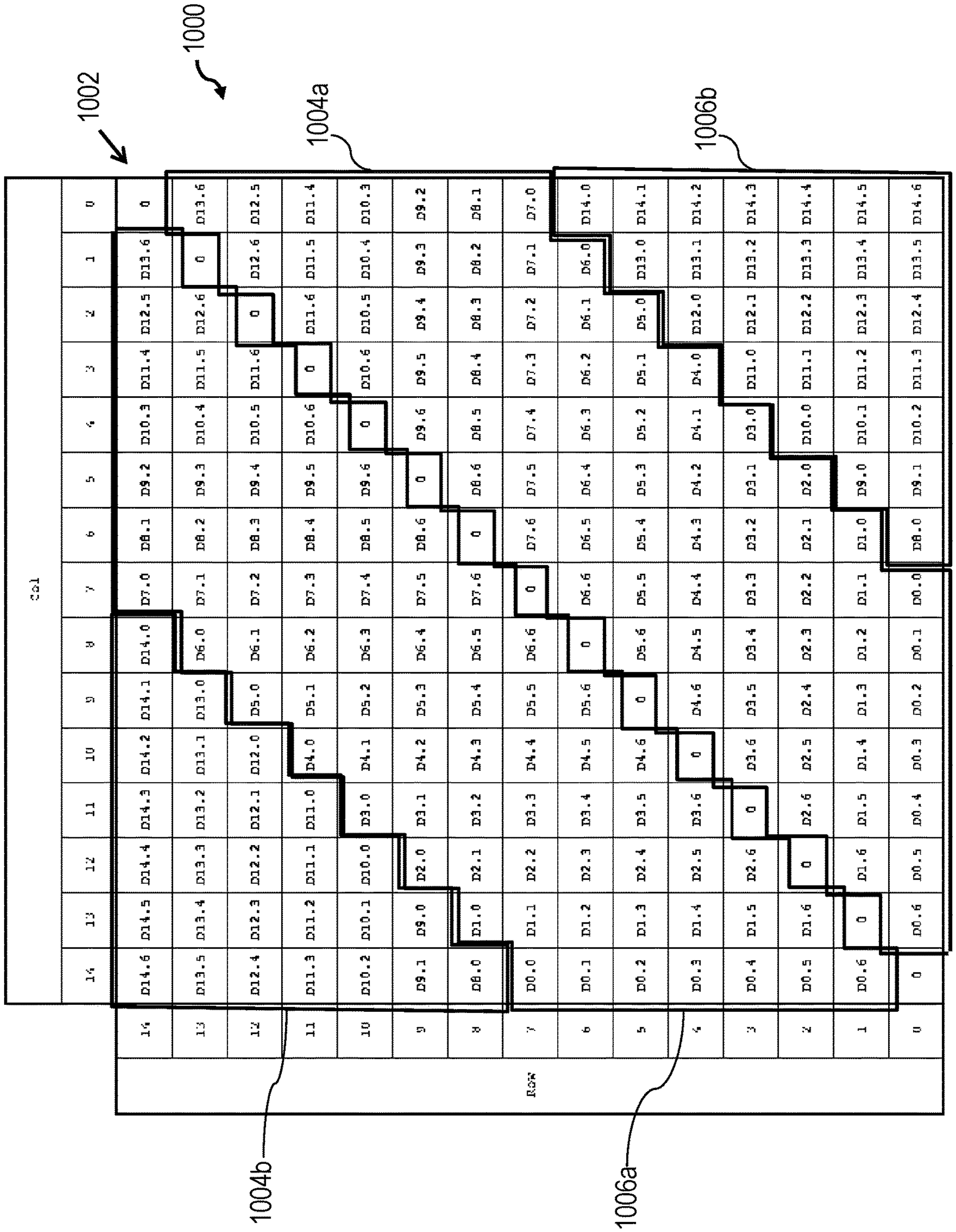
FIG. 10 depicts the data field of an HPC in which input data and duplicate data are reorganized to obtain an equal number of input data bits in each row.

In order to promote more efficient data packing, it is preferable if all rows of the HPC contain the same number of bits of input data. Accordingly, as shown in FIG. 10, the data bits of the data field 1000 of an HPC can be reassigned to different storage locations in order to achieve an equal number of input data bits in all rows. In this example, the input data bits are not all packed below zero major diagonal 1002. Instead, input data is packed into a first input data field 1004*a* below zero major diagonal 1002 as well as a second input data field 1004*b* above zero major diagonal 1002. Similarly, duplicate data is packed into a first duplicate data field 1006*a* above zero major diagonal 1002 as well as a second duplicate data field 1006*b* below zero major diagonal 1002. As a result of this arrangement, each row of data field 1000 includes H=7 bits of input data, where each bit is labeled to indicate the corresponding row and column position of the data in data field 900 of FIG. 9. Thus, for example, the storage locations (0,7) and (7,0) are labeled D0.0 to indicate that these storage locations hold the input data bit that would be stored in storage location (0,0) of data field 900.

Given the ability to pack a data field with equal length rows of input data, it is possible to form a half-size data array as illustrated in FIG. 11, which is sized to accommodate an equal number of input data bits of an HPC per row. In this example, half-size data array 1100 includes 15 rows (i.e., D rows) numbered 0 to 14 and 7 columns (i.e., H columns) numbered 0 to 6. It should be noted that half-size data array 1100 only contains an input data field 1104, but no duplicate data field. Half-size data array 1100 may also omit storage for an explicit zero major diagonal, but can instead include an implicit zero major diagonal 1102 including an implied ‘0’ bit per row.

Figure 12:
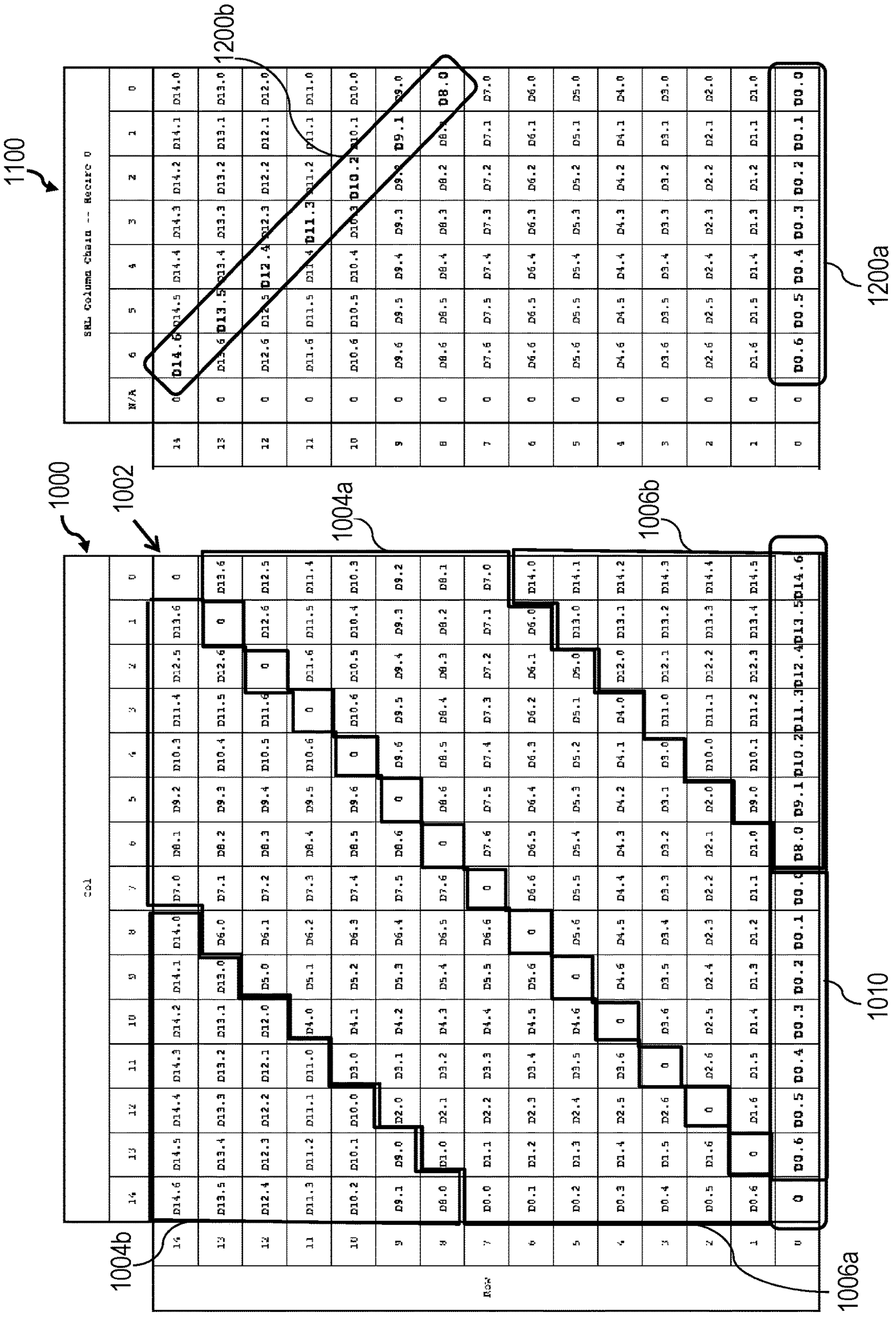
FIGS. 12-14 depict the correspondence between the processing of an HPC in a half-size data array and a conventional HPC array.

Given the packing of data bits within input data field 1104 of half-size array 1100, the parity for each row and column of an HPC can be computed by iteratively selecting and processing the same data bits as would processed in the conceptual HPC array 1000 depicted in FIG. 10. For example, FIG. 12 illustrates that the parity of row 0 1010 (and duplicate transpose column 14) of HPC array 1000 can be computed by applying a selected parity algorithm (e.g., BCH) to the 15 bits within row 0. These same data bits (i.e., the data bits found in row 0 of conceptual HPC array 1000) can be accessed from half-size data array 1100 by reading the corresponding 14 bits from diagonal data word 1200*b*, which includes data bits D14.6, D13.5, D12.4, D11.3, D10.2, D9.1 and D8.0, and horizontal data word 1200*a*, which includes data bits D0.0 to D0.6 (the '0' from zero major diagonal 1002 is implicit).

Figure 13:
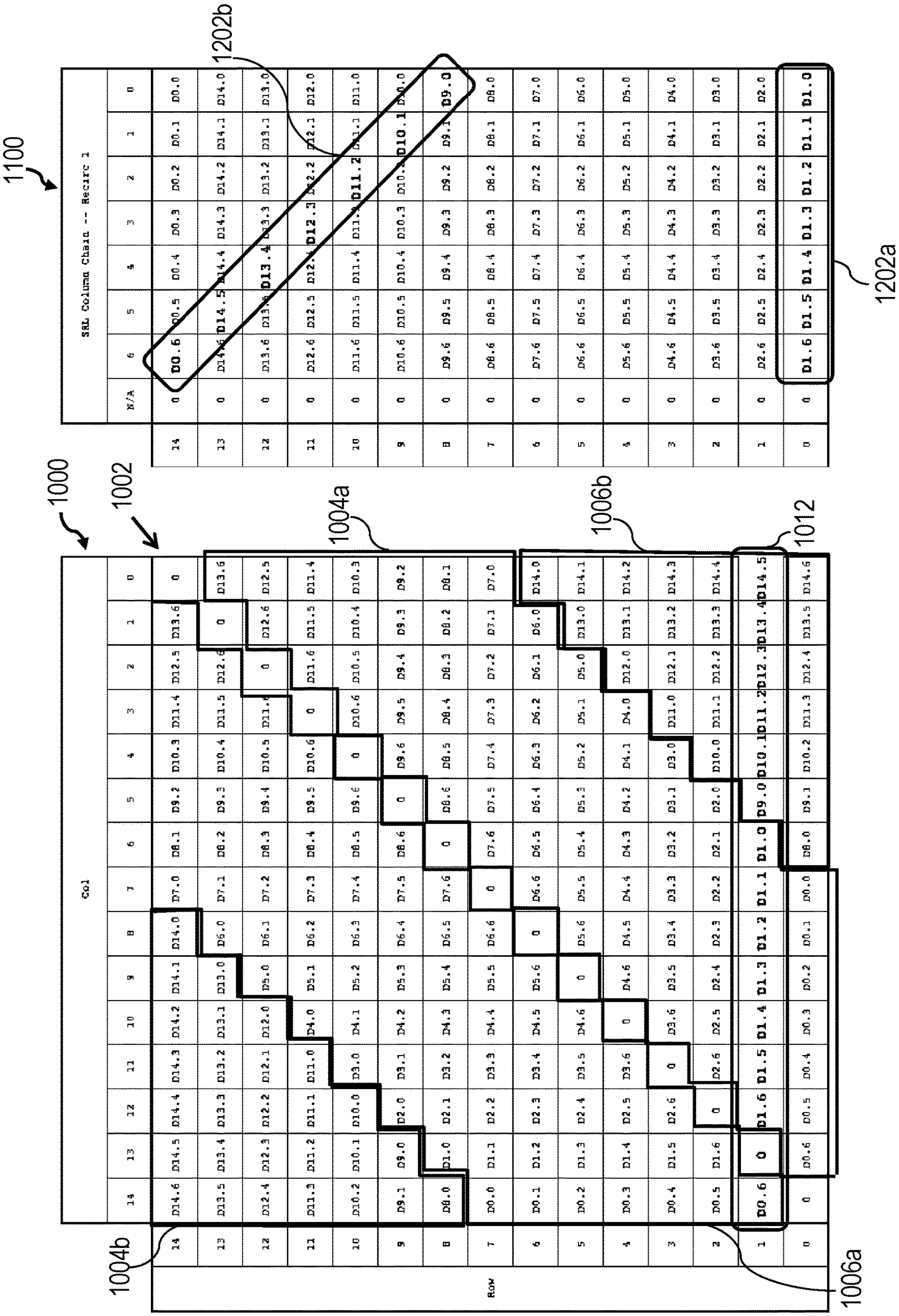

As further illustrated in FIG. 13, the parity of row 1 1012 (and duplicate transpose column 13) of HPC array 1000 can be computed by applying a selected parity algorithm (e.g., BCH) to the 15 bits within row 1. While it is possible to access the same data bits by shifting the access locations in half-size data array 1100 from those accessed in FIG. 12, in a preferred embodiment, the input data within half-size data array 1100 is instead shifted so that the access locations in half-size data array 1100 remain the same to process all rows of the conceptual HPC array. Thus, in a preferred embodiment, after the full 15 bits of row 0 of the conceptual HPC array are formed, the input data located in row 0 of half-size data array 1100 is "recirculated" back into the "top" (i.e., row 14) of half-size data array 1100 and the remaining input data within half-size array 1100 is shifted down one row. Thus, for example, after Data D0.[6-0] is loaded back into the top of the SRL array, all other input data is shifted "down" one row, and D1.[6-0] forming horizontal array 1202*a* is now stored within row 0 of half-size array 1100. Within the input data circulated in this fashion, row 1 of conceptual HPC array 1000 can be formed by again accessing diagonal data word 1202*b*, which includes data bits D0.6, D14.5, D13.4, D12.3, D11.2, D10.1 and D9.0, and horizontal data word 1202*a*, which includes data bits D1.0 to D1.6 (the '0' from zero major diagonal 1002 is again implicit).

Figure 14:
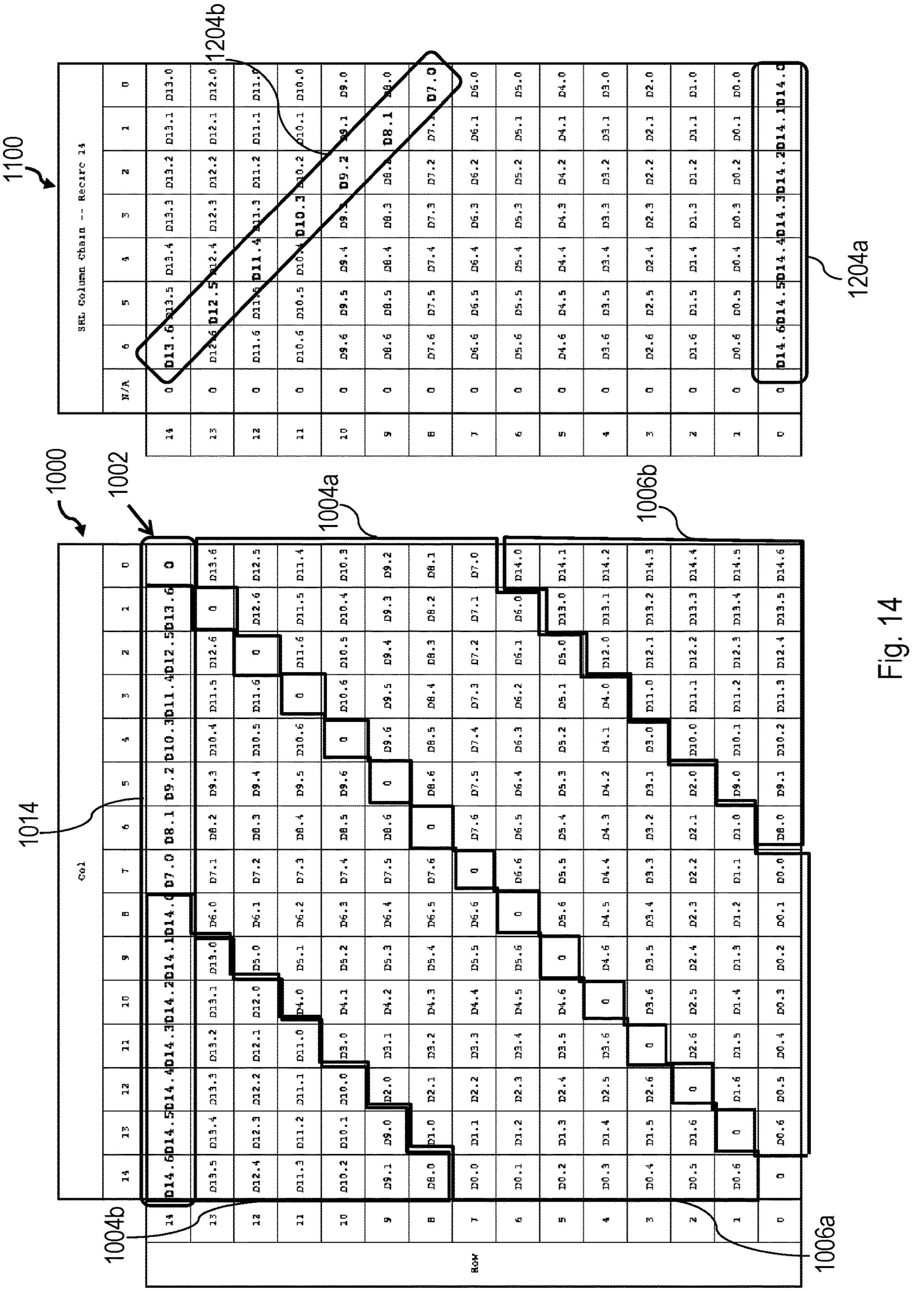

As depicted in FIG. 14, this process of accessing input data from half-size array 1100, forming a row of an HPC to calculate parity, and recirculating input data in half-size array 1100 continues until the input data bits corresponding to the top row 1014 (e.g., row 14) of conceptual HPC matrix 1000 are reached. The input data corresponding to top row 1014 of conceptual HPC array 1000 can be formed by again accessing diagonal data word 1204*b*, which includes data bits D13.6, D12.5, D11.4, D10.3, D9.2, D8.1 and D7.0, and horizontal data word 1204*a*, which includes data bits D14.0 to D14.6 (the '0' from zero major diagonal 1002 is again implicit). Again, throughout the process, the locations of input data accessed from half-size array 1100 do not change.

Figure 15:
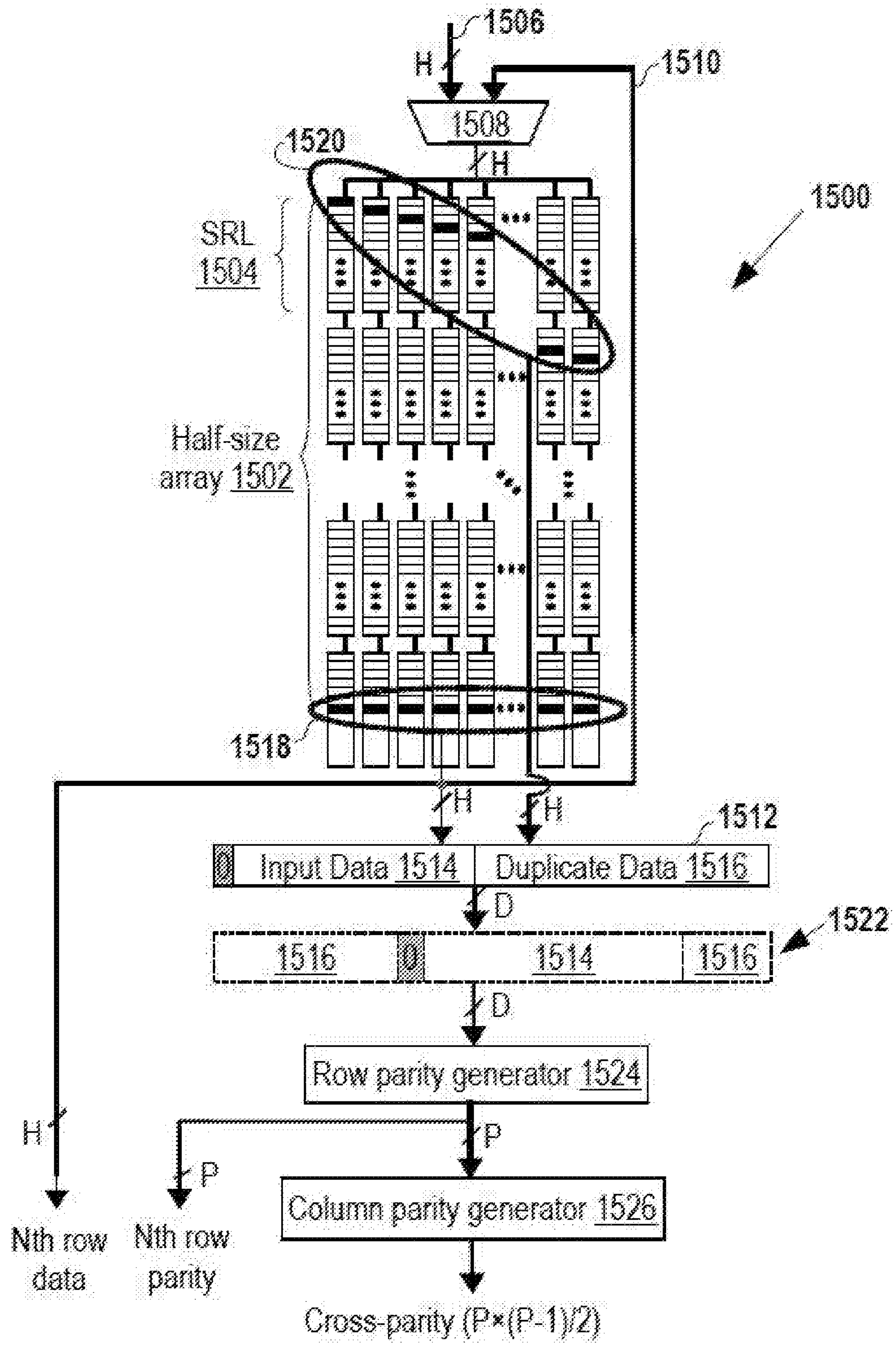
FIG. 15 illustrates a hardware-based encoder for encoding input data utilizing an HPC in accordance with one embodiment.

With reference now to FIG. 15, there is illustrated a hardware-based encoder for encoding input data utilizing an HPC in accordance with one embodiment. Encoder 1500 can be utilized to implement any of encoders 410, 510, or 744 discussed above.

As illustrated, encoder 1500 includes a half-size array 1502 for storing D rows of H bits of input data, where the data field of the corresponding conceptual HPC array is 2×H+1 (i.e., D) bits in each dimension and each row and column includes P bits of parity. In one preferred embodiment, half-size data array 1502 includes H columns formed of equal numbers of equally sized, serially connected shift registers, which may be implemented, for example, with shift register latches (SRLs) 1504. Each such column includes serialized storage for 2×H+1 (i.e., D) bits. In this embodiment, each column of the half-size array 1502 may be addressed independently across columns and even within columns, with each individual SRL 1504 receiving a single "address" and outputting a maximum of one data bit.

Data is received by encoder 1500 at an input multiplexer 1508, which has a first input coupled to an H-bit input bus 1506 and a second input coupled to an H-bit recirculation bus 1510 that recirculates a horizontal data word read out from half-size array 1502. During a packing phase during which input data is initially packed into half-size array 1502, encoder 1500 controls input multiplexer 1508 to select data presented at the first input for insertion into the next unoccupied row of half-size array 1502; during an encoding phase, encoder 1500 controls input multiplexer 1508 to selected data presented at the second input for insertion into the top row of half-size array 1502.

During the encoding phase, an HPC row register 1512 of size D=2×H+1 is loaded by reading two words of length H simultaneously from half-size array 1502. It should be noted that no single SRL 1504 within half-size array 1502 supplies more than a single bit of data to HPC row register 1512. In the illustrated embodiment, the leftmost bit of HPC row register is a '0' bit representing the bit supplied by the zero major diagonal of the conceptual HPC array, the next H bits are horizontal data word 1514 supplied from a predetermined horizontal row (e.g., bottom row 1518) of half-size array 1502, and the following H bits are the duplicate data bits 1516 supplied by diagonal data word 1520.

As indicated at reference numeral 1522, after HPC row register 1512 is loaded with HPC row data, the HPC row data is then rotated, as needed, either in HPC row register 1512 or another register. In the illustrated embodiment, the HPC row data is rotated N bits to the right, where N is the corresponding integer row number of the conceptual HPC array. Thus, for row 0, no rotation is performed, and for row 14, the HPC row data is rotated 14 bits to the right. As a result of the rotation, if performed, the '0' bit from the zero major diagonal is properly re-positioned within the HPC row data, and one or more bits of input data bits 1514 or duplicate data bits 1520 are wrapped.

Once the HPC row data is properly formatted by the rotation, if any, a row parity generator 1524 generates the P parity bits for the Nth row of the conceptual HPC array in accordance with the selected parity algorithm (e.g., BCH). These P row parity bits are fed into a column parity generator 1526 that calculates the P×P "cross-parity" sub-array 810 of the conceptual HPC array. It is important to note that encoder 1500 outputs for storage and/or transmission each of the D rows of data and parity (each having D+P bits), but preferably does not store or transmit (and instead discards) the duplicate data bits 1516 supplied by diagonal data word 1520 following row parity generation. Similarly, of the cross-parity sub-array 810 generated by column parity generator 1526, encoder 1500 preferably outputs only the P×(P−1)/2 bits below zero major diagonal 802.

Figure 16:
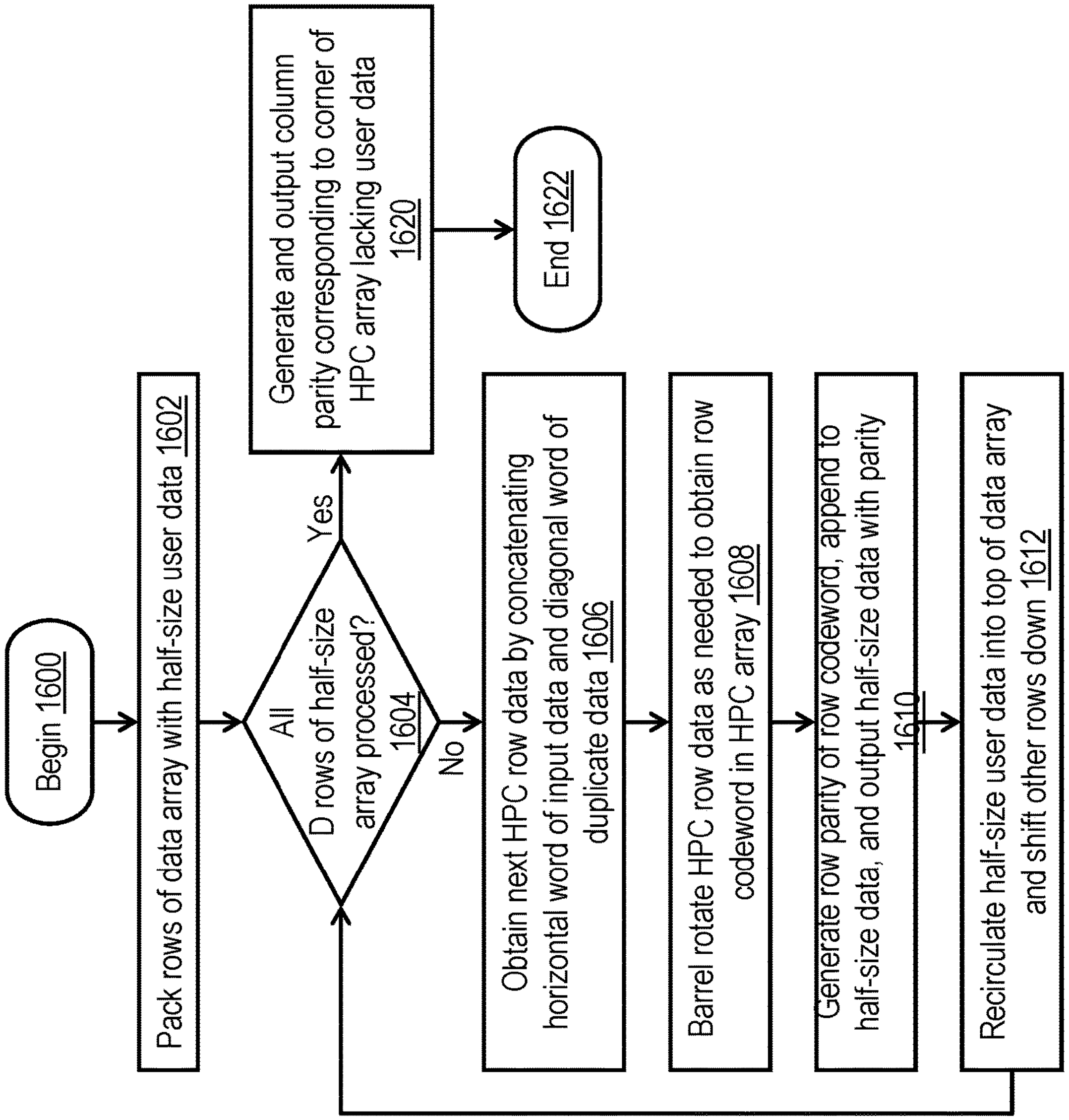
FIG. 16 is a high-level logical flowchart of an exemplary process by which the encoder of FIG. 15 encodes input data utilizing an HPC in accordance with one embodiment.

Referring now to FIG. 16, there is depicted a high-level logical flowchart of an exemplary process by which the encoder of FIG. 15 encodes input data utilizing an HPC data array in accordance with one embodiment.

The process begins at block 1600 in response to receipt by an encoder 1500 of input data to be encoded. The process then proceeds to block 1602, which illustrates the packing phase. During the packing phase, encoder 1500 controls input multiplexer 1508 to select incoming data from input bus 1506 and supplies the necessary addressing signals to fill half-size array 1502 by packing H-bit words of input data into all D rows of half-size array 1502. After half-size array 1502 is packed, encoder 1500 enters the encoding phase, which is represented by a processing loop including blocks 1604-1612.

At block 1604, encoder 1500 determines whether or not all D rows of half-size array 1502 have been processed. If so, the process proceeds to block 1620, which is described below. If not, encoder 1500 obtains HPC row data for next row of the conceptual HPC array by concatenating a horizontal H-bit word 1518 of input data with a diagonal H-bit word 1520 of duplicate data (block 1606). Encoder 1500 then barrel rotates the HPC row data N positions to the right, where N is an integer between 0 and D−1 indicating which row of half-size array 1502 is being processed (block 1608). Encoder 1500 then generates the P parity bits for the row codeword utilizing row parity generator 1524 (block 1610). Encoder 1500 additionally recirculates the horizontal H-bit word of input data 1514 read out from half-size array 1502 back into the top row of half-size array 1502 and shifts the other rows of input data within half-size array 1502 down one row (block 1612). This process iterates until encoder 1500 determines at block 1604 that all D rows of half-size array 1502 have been processed. In response to encoder 1500 determining at block 1604 that all D rows of half-size array 1502 have been processed, encoder 1500 generates and outputs the P×(P−1)/2 cross-parity bits below the zero major diagonal of the HPC data array utilizing column parity generator 1526 (block 1620). Thereafter, the process of FIG. 16 ends at block 1622.

Those skilled in the art will appreciate that the encoded data can be decoded utilizing a process similar to that illustrated in FIG. 16. In particular, a decoder 412, 512, or 746 packs a half-size array 1502 as discussed above. During the iterative processing of the HPC row data, the parity output by the row parity generator 1524 is compared to the stored or transmitted parity, and if one or more parity errors are detected, a conventional error correction circuit corrects the noted error(s), if possible. The decoded data can then be stored, transmitted, or otherwise processed.

As has been described, in at least one embodiment, an encoder encodes input data utilizing a binary symmetry-invariant product code. The encoder includes circuitry including a half-size data array including a data field having D rows each having storage for H bits. The encoder is configured to access bits of each row of the product code by reading a first H-bit data word from one of the D rows (e.g., a first row) and a second H-bit data word across H different rows of the half-size data array. The encoder additionally includes a register configured to receive the bits of each row of the product code and to rotate the bits to obtain the rows of the product code and a row parity generator configured to generate row parity for each row of the product code. The encoder finally includes a column parity generator configured to generate, based on the row parity, column parities for the parity bits of all rows of the product code.

The disclosed encoder performs encoding with significantly less logic than conventional techniques. The reduction in the required logic is attributable in part to eliminating the need to select input data from any arbitrary array position within the array storing input data to be encoded. The disclosed encoder also eliminates the need to form a full size data array including both input and duplicate data in order to calculate row and column parities. The disclosed encoder is capable of high performance and enables a full HPC row of data to be read from half-size array in a single cycle.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude signal media per se, transitory propagating signals per se, and forms of energy per se.

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. An encoder for encoding input data utilizing a binary symmetry-invariant product code including D data bits and P parity bits in each dimension, the encoder comprising circuitry including:

a half-size data array including D rows each having storage for H bits of input data, wherein D is an integer equal to 2×H+1, and wherein the encoder is configured to access bits of each row of the binary symmetry-invariant product code by reading a first H-bit data word from a selected one of the D rows of the half-size data array and a second H-bit data word across H different rows of the half-size data array;

a register configured to receive the bits of each row of the binary symmetry-invariant product code and to rotate the bits as needed to obtain the rows of the binary symmetry-invariant product code;

a row parity generator coupled to the register and configured to generate row parity for each row of the binary symmetry-invariant product code; and a column parity generator configured to generate, based on row parity generated by the row parity generator, column parities for the P parity bits of all rows of the binary symmetry-invariant product code.

2. The encoder of claim 1, wherein the binary symmetry-invariant product code is a half product code (HPC).

3. The encoder of claim 1, wherein the half-size data array comprises a plurality of shift registers.

4. The encoder of claim 1, wherein the encoder is configured to shift bits between rows of the half-size data array and to recirculate the first H-bit data word read from the half-size data array back into the half-size data array.

5. The encoder of claim 4, wherein the encoder forms all rows of the binary symmetry-invariant product code by reading a same set of bit storage locations within the half-size data array.

6. The encoder of claim 1, wherein the encoder is configured to pack the half-size data array with H bits of input data at a time.

7. The encoder of claim 1, wherein the encoder is configured to output D sets of encoded data each including H data bits and P parity bits.

8. The encoder of claim 7, wherein the encoder is further configured to output P×(P−1)/2 cross-parity bits.

9. A data storage system, comprising:

a non-volatile memory system; and a controller coupled to a non-volatile memory system, wherein the controller includes the encoder of claim 1.

10. A data communication system, comprising:

the encoder of claim 1; and a modulator configured to receive encoded data from the encoder, modulate the encoded data, and output the modulated encoded data on a communication channel.

11. A method of encoding a binary symmetry-invariant product code including D data bits and P parity bits in each dimension, the method comprising:

packing input data in a half-size data array including D rows each having storage for H bits of input data, wherein D is an integer equal to 2×H+1;

iteratively accessing bits of each row of the binary symmetry-invariant product code by reading a first H-bit data word from a selected one of the D rows of the half-size data array and a second H-bit data word across H different rows of the half-size data array;

rotating the bits of each row of the binary symmetry-invariant product code as needed to obtain the rows of the binary symmetry-invariant product code;

generating row parity for each row of the binary symmetry-invariant product code and generating, based on row parity generated by the row parity generator, column parities for the P parity bits of all rows of the binary symmetry-invariant product code; and outputting the first H-bit data words, row parities, and column parities.

12. The method of claim 11, wherein the binary symmetry-invariant product code is a half product code (HPC).

13. The method of claim 11, wherein packing the half-size data array comprises packing a plurality of shift registers.

14. The method of claim 11, and further comprising:

shifting bits between rows of the half-size data array; and recirculating the first H-bit data word accessed from the half-size data array back into the half-size data array.

15. The method of claim 14, wherein the accessing includes forming all rows of the binary symmetry-invariant product code by reading a same set of bit storage locations within the half-size data array.

16. The method of claim 11, wherein the packing includes packing the half-size data array with H bits of input data at a time.

17. The method of claim 11, wherein outputting the column parities includes outputting P×(P−1)/2 cross-parity bits.

18. The method of claim 11, and further comprising storing the first H-bit data words, row parities, and column parities in a non-volatile memory system.

19. The method of claim 11 and further comprising:

modulating encoded data including the first H-bit data words, row parities, and column parities and transmitting the modulated encoded data on a communication channel.

* * * * *